United States Patent

Uetani et al.

[11] Patent Number: 6,068,962
[45] Date of Patent: May 30, 2000

[54] POSITIVE RESIST COMPOSITION

[75] Inventors: Yasunori Uetani, Osaka; Hiroshi Moriuma, Nara; Jun Tomioka, Hyogo, all of Japan

[73] Assignee: Sumitomo Chemical Company, Limited, Osaka, Japan

[21] Appl. No.: 08/934,226

[22] Filed: Sep. 19, 1997

[30] Foreign Application Priority Data

| Sep. 20, 1996 | [JP] | Japan | 8-249801 |
| Oct. 1, 1996 | [JP] | Japan | 8-260921 |
| Oct. 29, 1996 | [JP] | Japan | 8-286424 |
| Nov. 27, 1996 | [JP] | Japan | 8-316099 |
| Nov. 27, 1996 | [JP] | Japan | 8-316100 |

[51] Int. Cl.$^7$ ................................ G03F 7/023
[52] U.S. Cl. .................... 430/191; 430/165; 430/192; 430/193; 430/920; 430/926
[58] Field of Search ................... 430/191, 192, 430/193, 165, 920, 926

[56] References Cited

U.S. PATENT DOCUMENTS

| 3,640,718 | 2/1972 | Smith | 430/270.1 |
| 3,890,152 | 6/1975 | Ruckert et al. | 430/175 |
| 4,163,672 | 8/1979 | Stahlhofen | 430/192 |
| 4,296,194 | 10/1981 | Harper et al. | 430/176 |
| 4,659,649 | 4/1987 | Dickinson et al. | 430/280.1 |
| 5,212,046 | 5/1993 | Lamola et al. | 430/270.1 |
| 5,272,042 | 12/1993 | Allen et al. | 430/270.1 |
| 5,338,641 | 8/1994 | Pawlowski et al. | 430/191 |
| 5,700,620 | 12/1997 | Sakaguchi et al. | 430/191 |
| 5,707,776 | 1/1998 | Kawabe et al. | 430/270.1 |
| 5,856,058 | 1/1999 | Sato et al. | 430/191 |

FOREIGN PATENT DOCUMENTS

| 0726500 | 12/1996 | European Pat. Off. |
| 9-015850 | 1/1997 | Japan |

Primary Examiner—John S. Chu
Attorney, Agent, or Firm—Birch, Stewart, Kolasch & Birch, LLP

[57] ABSTRACT

A non-chemically enhanced type positive resist composition includes an alkali-soluble novolak resin, a quinonediazide type sensitizer and at least one of the following compounds (a) and (b):

(a) an acid-generator which is decomposed by the action of an alkali developer and generates an acid, and (b) compounds represented by the following formula (IV) or (V):

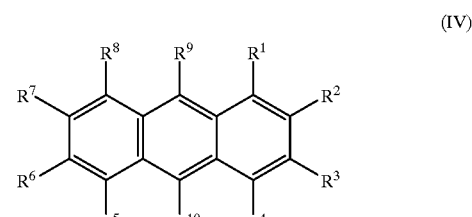

(IV)

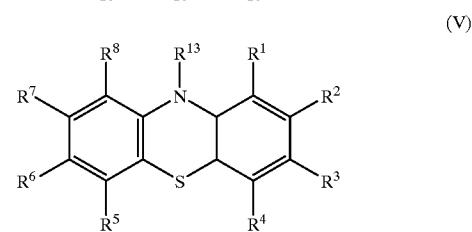

(V)

wherein each of $R^1$, $R^2$, $R^3$, $R^4$, $R^5$, $R^6$, $R^7$ and $R^8$ independently represents hydrogen, halogen, hydroxy, alkyl, alkoxy, aryl or nitro, each of $R^9$ and $R^{10}$ independently represents hydrogen, halogen, alkyl, aryl, nitro, a group of —$(CH_2)_n$—$OR^{11}$ or a group of —$(CH_2)_n$—$COOR^{12}$ in which $R^{11}$ represents hydrogen, alkyl, aryl or alkanoyl and $R^{12}$ represents hydrogen, alkyl or aryl, and n is a number from 0 to 3 and $R^{13}$ represents hydrogen, halogen, alkyl, alkoxy or aryl.

8 Claims, No Drawings

POSITIVE RESIST COMPOSITION

BACKGROUND OF THE INVENTION

1. Field of the Invention

The present invention relates to a positive resist composition which is sensitized against a radiation such as a ultraviolet ray to provide a positive pattern, and is suitable to be used for production of a semiconductor.

2. Description of the Related Art

A positive resist comprising a novolak resin as an alkali-soluble component and a quinonediazide compound as a radiation sensitive component gives a positive image by irradiation of a radiation through a mask (so-called patterning light exposure) and alkali developing, i.e. utilizing a phenomenon wherein the quinonediazide compound is decomposed by the action of the radiation to generate a carboxyl group and the quinonediazide compound turns from alkali-insoluble to alkali-soluble. Such a novolak/quinonediazide type positive resist is often used in production of an integrated circuit since it generally provides for good resolution.

Recently, production of an integrated circuit has required submicron pattern forming, with the progress of higher integration which requires more minute circuits. As a result, there is required a positive resist having not only good resolution but also good focus depth. Improvement of resolution can be attained by increasing the amount of radiation sensitive component. However, increase of the amount of radiation sensitive component causes radiation absorption of the resist increase and often causes film thickness reduction when being out of focus. Therefore, it has been difficult to improve resolution and focus depth simultaneously.

Good profile (pattern form) is also required for a positive resist. That is, for a pattern becoming more minute, round shape of the top surface of a pattern and a slope between the top and the bottom of a pattern have caused such problems that the pattern of the mask used in the light exposure can not be accurately transcribed onto the pattern formed by the resist. Therefore, there is required a positive resist composition which improves these defects and provides good profile.

Profile can be improved easily by enhancing transparency of a resist, specifically, by reducing the amount of a radiation sensitive component. However, when reducing the amount of a radiation sensitive component, resolution generally decreases. Profile can also be improved by enhancing the hydrophobicity of a novolak resin. However, when the hydrophobicity of a novolak resin is enhanced, the sensitivity of the resist generally decreases. In this way, it has been difficult to improve profile without lowering sensitivity and resolution.

SUMMARY OF THE INVENTION

An object of the present invention is to provide a positive resist composition exhibiting improved resolution and focus depth in a good balance.

Another object of the present invention is to provide a positive resist composition exhibiting good profile without lowering sensitivity and resolution, i.e. excellent in the balance of sensitivity, resolution and profile.

The present inventors have studied intensively to accomplish the foregoing objects and have found that sensitivity as well as focus are improved by incorporating a specific compound into a positive resist composition comprising a novolak resin as an alkali-soluble component and a quinonediazide compound as a radiation sensitive component. The present inventors have also found that profile is remarkably improved without lowering sensitivity and resolution by incorporating an acid generator into a positive resist composition comprising a novolak resin as an alkali-soluble component and a quinonediazide compound as a radiation sensitive component. Thus, the present invention was accomplished.

The present invention provides a non-chemically enhanced type positive resist composition comprising an alkali-soluble novolak resin, a quinonediazide type sensitizer and at least one of the following compounds (a) and (b):

(a) an acid-generator which is decomposed by the action of an alkali developer and generates an acid, and (b) compounds represented by the following formula (IV) or (V):

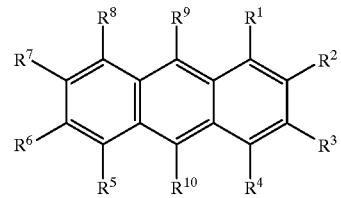

(IV)

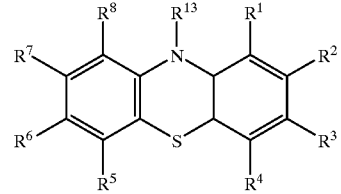

(V)

wherein each of $R^1$, $R^2$, $R^3$, $R^4$, $R^5$, $R^6$, $R^7$ and $R^8$ independently represents hydrogen, halogen, hydroxy, alkyl, alkoxy, aryl or nitro, each of $R^9$ and $R^{10}$ independently represents hydrogen, halogen, alkyl, aryl, nitro, a group of $-(CH_2)_n-OR^{11}$ or a group of $-(CH_2)_n-COOR^{12}$ in which $R^{11}$ represents hydrogen, alkyl, aryl or alkanoyl and $R^{12}$ represents hydrogen, alkyl or aryl, and n is a number from 0 to 3 and $R^{13}$ represents hydrogen, halogen, alkyl, alkoxy or aryl.

The positive resist composition of the present invention comprises an alkali-soluble novolak resin, a quinonediazide type sensitizer and is a non-chemically enhanced type positive resist composition. Therefore, the positive resist composition of the present invention is not a chemically enhanced type positive resist and does not require the presence of a compound which becomes soluble by the action of an acid, for example an alkali soluble resin in which at least a part of its functional group, such as a hydroxy group, is protected by a group which is removable by the action of an acid.

An alkali-soluble novolak resin which is generally used as an alkali-soluble component of an usual positive resist can be used as the alkali-soluble novolak resin of the positive resin composition of the present invention. The alkali-soluble novolak resin used in the present invention can be obtained by condensation of a phenol compound with an aldehyde in the presence of an acid catalyst. Examples of the phenol compound used in the production of a novolak resin include phenol, o-, m- or p-cresol, 2,3-, 2,5-, 3,4- or 3,5-xylenol, 2,3,5-trimetylphenol, 2-, 3- or 4-tert-butylphenol, 2-tert-butyl-4- or -5-methylphenol, 2-, 4- or 5-methylresorcinol, 2-, 3- or 4-methoxyphenol, 2,3-, 2,5- or 3,5-dimethoxyphenol, 2-methoxyresorcinol, 4-tert-butylcatechol, 2-, 3- or 4-ethylphenol, 2,5- or 3,5-diethylphenol, 2,3,5-triethylphenol, 2-naphthol, 1,3-, 1,5- or 1,7-dihydroxynaphthalene, and polyhydroxytriphenyl-methane compound obtained by condensation of xylenol with hydroxybenzaldehyde. These phenol compounds can be used alone or in combination of two or more.

Examples of the aldehyde used in the production of a novolak resin include aliphatic aldehydes such as formaldehyde, acetaldehyde, propionaldehyde, n-butylaldehyde, isobutylaldehyde, pivalaldehyde, n-hexylldehyde, acrolein and crotonaldehyde; alicyclic aldehydes such as cyclohexanealdehyde, cyclopentanealdehyde, furfural and furylacrolein; aromatic aldehydes such as benzaldehyde, o-, m- or p-methylbenzaldehyde, p-ethylbenzaldehyde, 2,4-, 2,5-, 3,4- or 3,5-dimethylbenzaldehyde, o-, m- or p-hydroxybenzaldehyde, o-, m- or p-anisaldehyde and vanillin; and aromatic aliphatic aldehydes such as phenylacetaldehyde and cinnamaldehyde. These aldehydes can also be used alone respectively or in combination of two or more. Among these aldehydes, formaldehyde is preferably used because of industrial availability thereof.

Examples of the acid catalyst used for the condensation of a phenol compound with an aldehyde include inorganic acids such as hydrochloric acid, sulfuric acid, perchloric acid and phosphoric acid; organic acids such as formic ad, acetic acid, oxalic acid, trichloroacetic acid and p-toluenesulfonic acid; and divalent metal salts such as zinc acetate, zinc chloride and magnesium acetate. These acid catalyst can be also used alone respectively or in combination of two or more. The condensation reaction can be conducted according to a conventional manner, and for example, can be conducted at a temperature from 60 to 120° C. for 2 to 30 hours.

The novolak resin obtained by condensation is preferably subjected to treatment such as fractionation so that the ratio of the area of components having a molecular weight of not more than 1000 in gel permeation chromatography (GPC) pattern to the area of the total pattern except unreacted phenol compound is not more than 25%, more preferably not more than 20%. Here, the pattern area is obtained by GPC using a 254 nm UV detector, and the molecular weight means a molecular weight converted as polystyrene.

It is also effective to add an alkali-soluble phenol compound having a molecular weight of not more than 1000 to the novolak resin of which content of higher molecular weight components has thus been increased. As the alkali-soluble phenol compound having a molecular weight of not more than 1000, a compound having at least two phenol hydroxyl groups in a molecule is preferable, and examples thereof include compounds described in JP-A-2-275955 (=U.S. Pat. No. 5,456,995+U.S. Pat. No. 5,456,996) and JP-A-2-2560 and the like. It is preferable that the alkali-soluble phenol compound is contained in an amount from 3 to 40% by weight based on the total amount the novolak resin and the alkali phenol-based compound.

The quinonediazide type sensitizer used in the present invention may be a conventional agent which is generally used as a sensitizer of a positive resist composition, and usually is an o-quinonediazide sulfonate of a compound having a phenol hydroxyl group. The sensitizer is preferably 1,2-naphtoquinonediazide-5- or -4-sulfonate or 1,2-benzoquinonediazide-4-sulfonate of a polyhydroxyl compound having at least three phenol hydroxyl groups. These ester can be produced by reacting a compound having phenol hydroxyl groups with an o-quinonediazide sulfonic acid halide in the presence of a base such as triethylamine and the like. The o-quinonediazide sulfonic halide is particularly preferably a 1,2-naphthoquinonediazide-5-sulfonic acid chloride. These quinonediazide type sensitizers can be used alone respectively or in combination of two or more. It is preferable that the sensitizer is contained in an amount usually from 10 to 100% by weight, more preferably from 10 to 50% by weight, based on the total amount of the novolak resin and the above-described alkali-soluble phenol compound optionally used.

The positive resist composition of the present invention comprises at least one of the following compounds (a) and (b):

(a) an acid-generator, and (b) compounds represented by the formula (IV) or (V).

in addition to the alkali-soluble novolak resin and the quinonediazide type sensitizer.

The acid generator is a compound which is decomposed by the action of an alkali developer and generates an acid. By incorporating the acid generator in a positive resist composition comprising the alkali-soluble novolak resin and the quinonediazide type sensitizer, improved profile can be obtained without lowering sensitivity and resolution of the resist. Examples the acid generator include ester compounds, such as carboxylates or sulfonates, amide compounds, such as carboxylic acid amides or sulfonamides, and compounds having a diazomethanedisulfonyl bone. As the amide compound, a tertiary amide is preferred. As the ester compound and the amide compound, a compound having a cyclic structure, such as a dicarboxyimide bone and benzene nucleus, is preferred. It is preferable that products generated by decomposition of the acid generator are alkali-soluble.

Specific examples of the acid generator which is suitably used in the present invention include compounds represented by the following formula (I), (II) or (III):

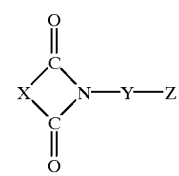 (I)

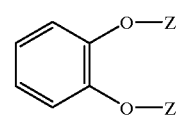 (II)

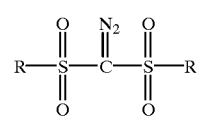 (III)

wherein X represents a divalent hydrocarbon group, Y represents a direct bond or an oxygen atom, Z represents

R represents an alkyl which may be optionally substituted by alkoxy, halogen or nitro, alicyclic hydrocarbon residue, aryl which may be optionally substituted by alkyl, alkoxy, halogen or nitro, aralkyl which may be optionally substituted by alkyl, alkoxy, halogen or nitro, or camphor group.

Examples of the divalent hydrocarbon group represented by X in the formula (I) include alkylene, alkenylene, divalent group of alicyclic hydrocarbon and arylene. The alkylene includes, for example, an alkylene having 1 to 6 carbon atoms, and it may be straight chain or branched. Specific examples of the alkylene include ethylene, propylene and trimethylene. The alkenylene includes, for example, an alkenylene having 2 to 4 carbon atoms, and it may be straight chain or branched. Specific examples of the alkenylene include vinylene. The divalent group of an alicyclic hydrocarbon includes, for example, a monocyclic group such as 1,2-cyclohexylene and a crosslinked polycyclic group such as 5-norbornene-2,3-diyl. The arylene includes, for example, a phenylene and a naphthylene, and these phenylene and naphthylene may have a substituent such as an alkyl. The phenylene is usually 1,2-phenylene, and the naphthylene is usually 1,2-, 2,3- or 1,8-naphthylene.

Examples of the preferable compound represented by the formula (I) include the compounds represented by the following formula (Ia) or (Ib):

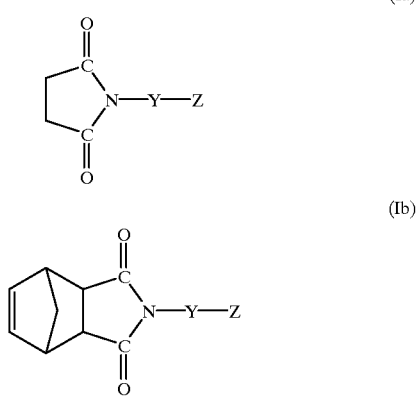

wherein Y and Z are as defined above.

R in Z in the formulae (I), (Ia), (Ib) and (II) and R in the formula (III) represents an alkyl, alicyclic hydrocarbon residue, aryl, aralkyl or camphor group.

The alkyl group represented by R includes, for example, a compound having 1 to 10 carbon atoms, and may be unsubstituted or substituted, and in the case of a compound having 3 or more carbon atoms, it may be straight chain or branched. Example of the substituent of the alkyl include an alkoxy (preferably having 1 to 4 carbon atoms), halogen such as fluorine, chlorine and bromine, and nitro. The alicyclic hydrocarbon residue means a monovalent group derived from a hydrocarbon having a alicyclic ring, and may be monocyclic or crosslinked polycyclic. Specific examples thereof include monocyclic groups such as cyclohexyl and cyclohexylmethyl, and polycyclic groups such as adamantyl (namely, a monovalent group derived from adamantane, especially 1-adamantyl). The aryl group includes, for example, phenyl, naphthyl or anthryl, and these phenyl, naphtyl and anthryl may be respectively unsubstituted or substituted. Examples of the substituent of the phenyl, naphthyl or anthryl include an alkyl (preferably having 1 to 4 carbon atoms), alkoxy (preferably having 1 to 4 carbon atoms), halogen such as fluorine, chlorine and bromine and nitro. The aralkyl group includes, for example, benzyl or phenetyl. An aromatic ring moiety in these aralkyl groups may also have a substituent such as an alkyl, alkoxy, halogen and nitro. The camphor group means a monovalent group derived from camphor. In particular, a 10-camphor group, namely a group obtained, for example, by removing a sulfonic acid group from 10-camphorsulfonic acid, is preferred.

A certain kind of the above-described acid generator can also be used in a so-called chemically enhanced type positive resist composition, in which the acid generator is decomposed by the action of radiation ray used for patterning light exposure. However, since the positive resist composition of the present invention is not a chemically enhanced type positive resist, the acid generator used in the present invention is not required to manifest sensitizing property against the radiation used for patterning light exposure and may be a compound which is decomposed by an alkali developer used in developing after patterning light exposure and generates an acid. The acid generator used in the present invention may be exist in an amount to act as a solution promoting agent. It is generally preferable that the amount of the acid generator is from 0.5 to 20% by weight based on the total solid amount in the resist composition. When this amount is too small, the effect of the present invention becomes insufficient, and when the amount is too large, non-exposed parts are easily dissolved in an alkali developer, therefore profile may become poor.

The compounds represented by the formulae (I) to (III) can be produced according to a known method. Some of them are commercially available, which can be used without any treatment. For example, a compound represented by the formula (I) in which Y represents a direct bond can be produced by condensation of a corresponding dicarboxyimide such as succinimide and 5-nonbornene-2,3-dicarboxyimide with sulfonyl chloride or carbonyl chloride represented by a formula: Cl—Z (wherein, Z is as defined above) in the basic condition. Further, an compound represented by the formula (I) in which Y represents an oxygen atom can be produced by condensation of a corresponding N-hydroxydicarboxyimide such as N-hydroxysuccinimide and N-hydroxy-5-nonbornene-2,3-dicarboxyimide with the above-described sulfonyl chloride or carbonyl chloride in the basic condition. The ester compound represented by the formula (II) can be produced by condensation of catechol with the above-described sulfonyl chloride or carbonyl chloride in the basic condition. Further, the compound represented by the formula (III) can be produced by reacting a compound represented by the formula: R—SH with methylene chloride in the presence of an oxidizing agent to form $RSO_2CH_2SO_2R$, followed by diazotizing this compound by p-toluenesulfonylazide and the like. Commercially available products of the compound represented by the formula (III) can also be used without any treatment.

Specific examples of the compound represented by the formula (Ia) include the following compounds.

(1) 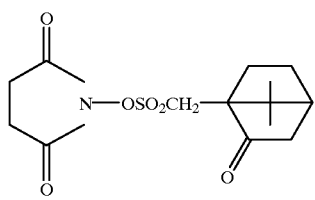
(2) 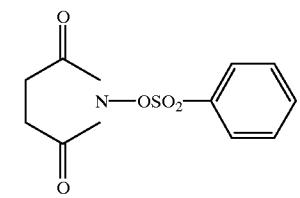
(3) 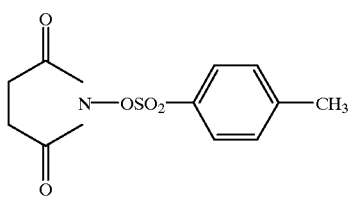
(4) 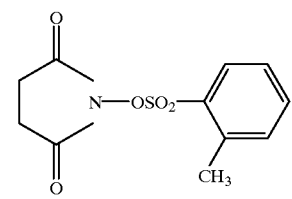
(5) 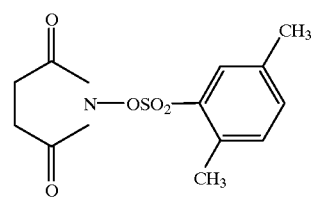
(6) 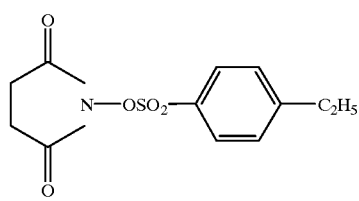
(7) 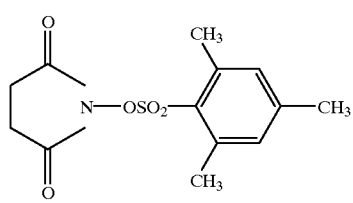
-continued
(8) 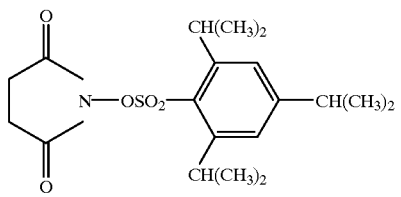
(9) 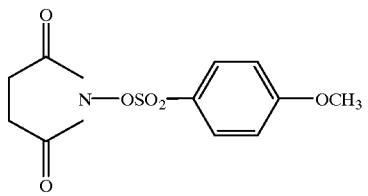
(10) 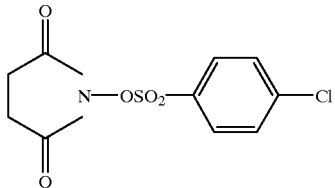
(11) 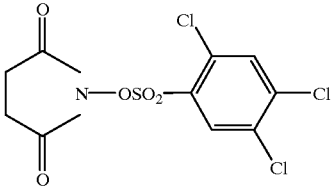
(12) 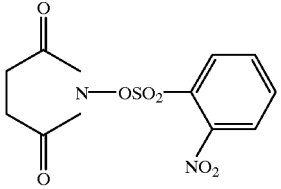
(13) 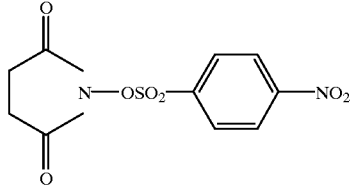
(14) 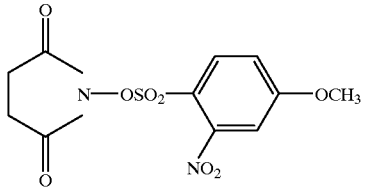

(15) 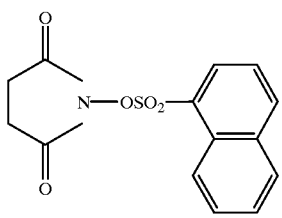
(16) 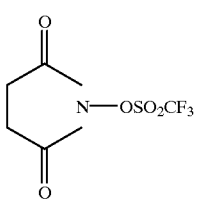
(17) 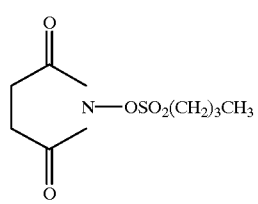
(18) 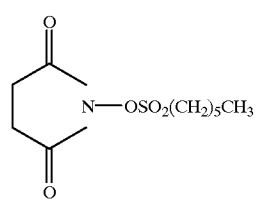
(19) 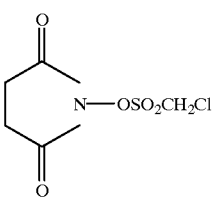
(20) 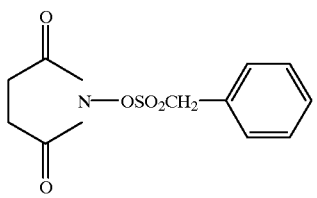
(21) 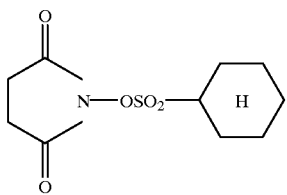
(22) 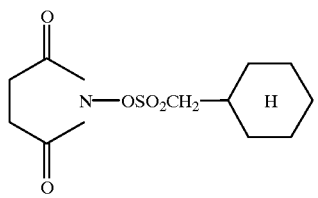
(23) 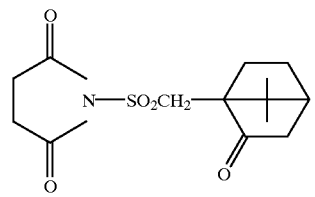
(24) 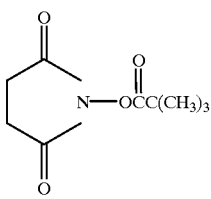
(25) 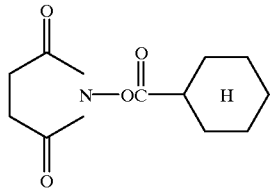
(26) 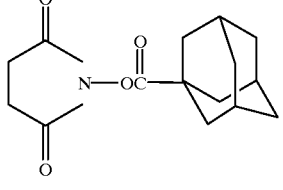
(27) 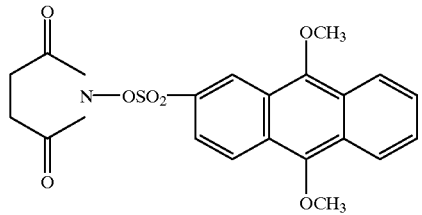
Specific examples of the compound represented by the formula (Ib) include the following compounds.
(31) 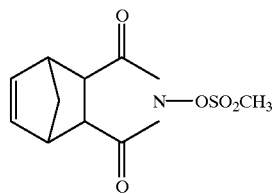

-continued

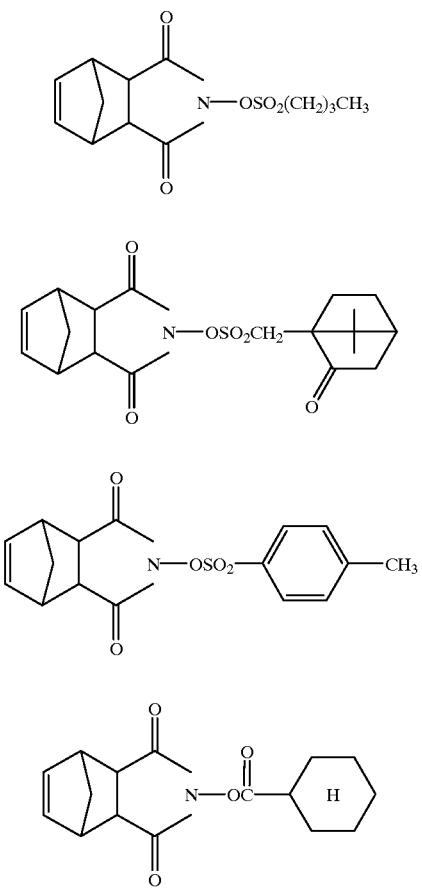

Specific examples of the ester compound represented by the formula (II) include the following compounds.

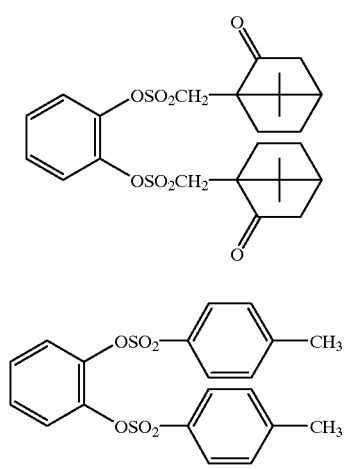

Specific examples of the diazomethanedisulfonyl compound represented by the formula (III) include the following compounds.

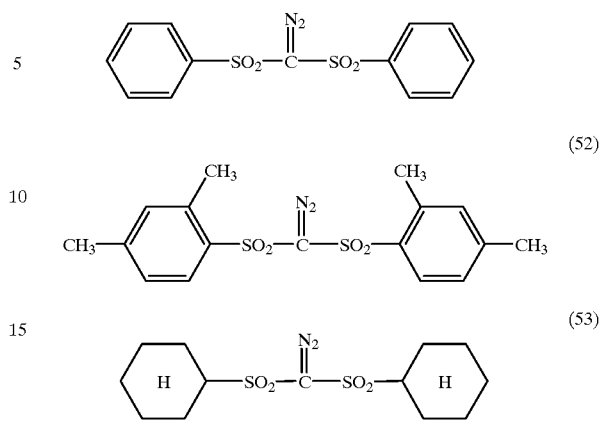

By incorporating a compound represented by the formula (IV) or (V) in a positive resist composition comprising alkali-soluble novolak resin and the quinonediazide type sensitizer, there is provided a further excellent resolution without lowering focus depth. It is preferable that the compound represented by the formula (IV) or (V) is incorporated in an amount generally from 0.01 to 5% by weight based on the total solid amount in the resist composition.

In the definition of the above-described (IV) and (V), examples of the halogen include fluorine, chlorine and bromine;

examples of the alkyl group include an alkyl group having 1 to 6 carbon atoms;

examples of the alkoxy group include an alkoxy group having 1 to 6 carbon atoms;

examples of the alkanoyl group include an alkanoyl group having 2 to 6 carbon atoms including the carbon atoms of its carbonyl part, and examples of the aryl group include phenyl, naphthyl and anthryl. To an aromatic ring such as phenyl, naphthyl and anthryl ring constituting the aryl group may be substituted with one or more substituent such as alkyl, alkoxy, hydroxy, carboxyl, halogen and nitro.

Among the above-described compound represented by the formula (IV) or (V), anthracene compounds represented by the formula (IV) are preferred. Particularly preferable examples thereof include unsubstituted anthracene, and anthracenes having a substituent at least at 2 and/or 9 positions, which may further have a substituent at other position. Specific examples of anthracenes which have a substituent at 2 and/or 9 positions include the following compounds.

9-anthracenemethanol
9-anthracenemethanol acetate
9-anthracenecarboxylic acid
2-methylanthracene
2-ethylanthracene
2-t-butylanthracene
2-methyl-9,10-dimethoxyanthracene
2-methyl-9,10-diethoxyanthracene
2-ethyl-9,10-dimethoxyanthracene
2-ethyl-9,10-diethoxyanthracene
2-t-butyl-9,10-dimethoxyanthracene
2-t-butyl-9,10-diethoxyanthracene
2,3-dimethyl-9,10-dimethoxyanthracene
4-(9-anthrylcarbonyloxy) benzoic acid
4-(9-anthrylcarbonyloxy)-3-hydroxy benzoic acid
1,4,9,10-anthracenetetrol
4,9,10-trihydroxy-1-anthryl 9-anthracene carboxylate, and the like.

The positive resist composition of the present invention may comprises one of (a) an acid-generator and (b) compounds represented by the formula (IV) or (V), or may comprises both of (a) and (b).

The above-described components in the positive resist composition of the present invention are usually dissolved in a solvent to prepare a resist solution. The solution thus obtained is applied on a substrate such as a silicon wafer. A solvent which dissolves the above-described components, has suitable drying speed, and provide a uniform and smooth coated film after evaporation of the solvent, may be used for preparing the resist solution. A solvent usually used in this technical field can be used for preparing the resist solution. Examples thereof include glycol ether esters such as ethylcellosolve acetate, methylcellosolve acetate, propylene glycol monomethyl ether acetate and propylene glycol monoethyl ether acetate; glycol ethers such as ethyl cellosolve, methyl cellosolve, propylene glycol monomethyl ether and propylene glycol monoethyl ether; esters such as ethyl lactate, butyl acetate, amyl acetate and ethyl pyruvate; ketones such as 2-heptanone and cyclohexanone; and cyclic esters such as γ-butyrolactone. These solvents can be used alone respectively or in combination of two or more.

The resist composition of the present invention can contain a small amount of additives usually used in this technical field such as resins other than a novolak resin, dye, surface active agent and the like.

Resist film formed by applying the resist solution on a substrate is irradiated with a radiation through a mask for patterning and then is developed with an alkali developer. The alkali developer used herein can be various alkaline aqueous solutions used in this field, and generally an aqueous solution of tetramethylammonium hydroxide is used.

The following examples further illustrate the present invention in detail but are not to be construed to limit the scope thereof. In the examples, all "parts" are by weight unless otherwise indicated. Molecular weights were measured by GPC and were converted to polystyrene.

EXAMPLES 1 TO 24 AND COMPARATIVE EXAMPLE 1

(a) Preparation of Novolak Resin A

M-cresol/p-cresol/formaldehyde were reacted according to a conventional method under reflux in the presence of a oxalic acid catalyst at a molar ratio of 40/60/80, then the mixture was fractionated to obtain a novolak resin (hereinafter referred to as novolac resin A). Novolak resin A has a weight-average molecular weight of 8000. The area ratio of its GPC pattern area corresponding to the component having a molecular weight of not more than 6000 and the pattern area corresponding to the component having a molecular weight of not more than 1000 to the total pattern area except the pattern area of a unreacted cresol is 34% and 15% respectively.

(b) Preparation of Quinonediazide Type Sensitizer C 2,4,4-trimethyl-2',4',7-trihydroxyflavan having a structure represented by the following formula:

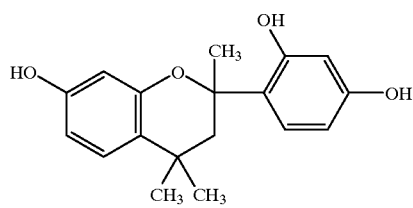

and 1,2-naphthoquinonediazide-5-sulfonic acid chloride were reacted at a molar ratio of 1:2.4 to obtain a condensate (hereinafter referred to as sensitizer C).

(c) Acid Generator

The following compounds were used. Each number corresponds to the number of the previously exemplified compound.

(1) N-(10-camphorsulfonyloxy)succinimide
(3) N-(p-methylphenylsulfonyloxy)succinimide
(4) N-(o-methylphenylsulfonyloxy)succinimide
(10) N-(p-chlorophenylsulfonyloxy)succinimide
(15) N-(1-naphtylsulfonyloxy)succinimide
(16) N-(trifluoromethylsulfonyloxy)succinimide
(17) N-(n-butylsulfonyloxy)succinimide
(18) N-(n-hexylsulfonyloxy)succinimide
(19) N-(chloromethylsulfonyloxy)succinimide
(21) N-(cyclohexylsulfonyloxy)succinimide
(22) N-(cyclohexylmethylsulfonyloxy)succinimide
(23) N-(10-camphorsulfonyl)succinimide
(24) N-(pivaroyloxy)succinimide
(25) N-(cyclohexylcarbonyloxy)succinimide
(26) N-(1-adamantanecarbonyloxy)succinimide
(27) N-(9,10-dimethoxy-2-anthrylsulfonyloxy)succinimide
(31) N-(methylsulfonyloxy)-5-norbornene-2,3-dicarboxyimide
(32) N-(n-butylsulfonyloxy)-5-norbornene-2,3-dicarboxyimide
(33) N-(10-camphorsulfonyloxy)-5-norbornene-2,3-dicarboxyimide
(41) 1,2-phenylene bis(10-camphorsulfonate)
(52) bis(2,4-dimethylphenylsulfonyl)diazomethane
(53) bis(cyclohexylsulfonyl)diazomethane (d) Preparation of Resist Solution and Evaluation 10 Parts of Novolak resin A, 3.5 parts of Sensitizer C, 5 parts of 4,4'-(2-hydroxybenzylidene)di-2,6-xylenol as an additive and 45 parts of 2-heptanone as a solvent were mixed. To this solution was added an acid generator shown in Table 1. Then, the mixture was filtered through a 0.2 μm fluorine resin filter to prepare a resist solution. The amount of the acid generator in Table 1 is represented by % by weight based on the total solid amount in the resist solution before addition thereof.

Onto a silicon wafer treated with hexamethyldisalazane (HMDS) was spin-coated the resist solution obtained above so that the film thickness after drying became 1.06 μm. Prebaking was conducted on a direct hot plate at a temperature of 90° C. for 60 seconds. Thus obtained wafer on which a resist film had been formed was irradiated through a line and space pattern with changing the irradiation amount gradually using an i-line stepper ("NSR 2005i9C" manufactured by Nikon Corp., NA=0.57, σ=0.60). Then, on a hot plate, post exposure baking was conducted at a temperature of 110° C. for 60 seconds, followed by conducting paddle developing for 60 seconds using a 2.38% by weight tetramethylammonium hydroxide aqueous solution. The pattern after the developing was observed by a scanning electron microscope, and the effective sensitivity, resolution and profile thereof were evaluated as follows and the results are shown in Table 1.

Effective sensitivity: It was represented by exposure amount when the cross section of 0.50 μm line and space pattern was 1:1.

Resolution: It was represented by the minimum line width of line and space pattern which was resolved at the light exposure amount of the effective sensitivity.

Profile: It was represented by the ratio (T/B) of the width of the top (T) and the width of the bottom (B) of line part of 0.50 μm line and space pattern at the effective sensitivity. When T/B is nearer to 1, profile is rectangle and pattern form is better.

TABLE 1

| Example No. | Acid generator | Effective sensitivity | Resolution | Profile |
|---|---|---|---|---|
| Example 1 | (1)/5% | 255 msec | 0.375μm | 0.92 |
| Example 2 | (1)/2% | 265 msec | 0.40 μm | 0.88 |
| Example 3 | (1)/10% | 240 msec | 0.40 μm | 0.95 |
| Example 4 | (3)/5% | 250 msec | 0.375μm | 0.93 |
| Example 5 | (4)/5% | 260 msec | 0.375μm | 0.92 |
| Example 6 | (10)/5% | 265 msec | 0.375μm | 0.92 |
| Example 7 | (15)/5% | 255 msec | 0.375μm | 0.92 |
| Example 8 | (16)/5% | 280 msec | 0.375μm | 0.90 |
| Example 9 | (17)/5% | 250 msec | 0.375μm | 0.92 |
| Example 10 | (18)/5% | 255 msec | 0.375μm | 0.93 |
| Example 11 | (19)/5% | 255 msec | 0.375μm | 0.92 |
| Example 12 | (21)/5% | 255 msec | 0.375μm | 0.92 |
| Example 13 | (22)/5% | 260 msec | 0.375μm | 0.93 |
| Example 14 | (23)/5% | 245 msec | 0.40 μm | 0.88 |
| Example 15 | (24)/5% | 240 msec | 0.40 μm | 0.90 |
| Example 16 | (25)/5% | 240 msec | 0.40 μm | 0.92 |
| Example 17 | (26)/5% | 240 msec | 0.40 μm | 0.92 |
| Example 18 | (27)/5% | 260 msec | 0.375μm | 0.94 |
| Example 19 | (31)/5% | 250 msec | 0.375μm | 0.92 |
| Example 20 | (32)/5% | 255 msec | 0.375μm | 0.93 |
| Example 21 | (33)/5% | 255 msec | 0.375μm | 0.93 |
| Example 22 | (41)/5% | 280 msec | 0.375μm | 0.93 |
| Example 23 | (52)/5% | 280 msec | 0.375μm | 0.92 |
| Example 24 | (53)/5% | 270 msec | 0.40 μm | 0.92 |
| Comparative example 1 | None | 280 msec | 0.40 μm | 0.78 |

EXAMPLES 25 TO 36

In these examples, the following compounds, included in the compounds represented by the formula (IV) or (V), (hereinafter referred to as sensitizing agent) were blended in addition to the acid generator to the positive resist compositin.

A: 9-anthracenemethanol
B: 9-anthracenemethanol acetate
C: 9-anthracenecarboxylic acid
D: anthracene
E: 2-ethyl-9,10-dimethoxyanthracene
F: 4-(9-anthrylcarbonyloxy)benzoic acid
G: 2-methyl-9,10-dimethoxyanthracene
H: 2-t-butyl-9,10-dimethoxyanthracene
I: 2-ethyl-9,10-diethoxyanthracene
J: 2-t-butylanthracene
K: phenothiazine 10 Parts of Novolak resin A, 3.5 parts of Sensitizer C, 5 parts of 4,4'-(2-hydroxybenzylidene)di-2,6-xylenol as an additive and 45 parts of 2-heptanone as a solvent were mixed. To this solution were added the acid generator and an above-described compound as shown in Table 2, then the mixture was filtered through a 0.2 μm fluorine resin filter to prepare a resist solution. The amounts of the acid generator and the sensitizing agent were represented by % by weight based on the total solid amount in the resist solution before addition thereof. Using this resist solution, the formation of a resist film, forming of pattern and evaluation were conducted in the same manner as in Example 1. The evaluation results are together shown in Table 2.

TABLE 2

| Example No. | Acid generator | Sensitizing agents | Effective sensitivity | Resolution | Profile |
|---|---|---|---|---|---|
| Example 25 | (1)/5% | A/0.5% | 265 msec | 0.35 μm | 0.92 |
| Example 26 | (1)/5% | A/1.5% | 280 msec | 0.33 μm | 0.90 |
| Example 27 | (1)/5% | B/1.5% | 280 msec | 0.32 μm | 0.90 |
| Example 28 | (1)/5% | C/1.5% | 255 msec | 0.35 μm | 0.93 |
| Example 29 | (1)/5% | D/1.5% | 265 msec | 0.34 μm | 0.92 |
| Example 30 | (1)/5% | E/1.5% | 280 msec | 0.32 μm | 0.93 |
| Example 31 | (1)/5% | F/1.5% | 230 msec | 0.34 μm | 0.94 |
| Example 32 | (1)/5% | G/1.5% | 280 msec | 0.32 μm | 0.92 |
| Example 33 | (1)/5% | H/1.5% | 260 msec | 0.32 μm | 0.93 |
| Example 34 | (1)/5% | I/1.5% | 260 msec | 0.32 μm | 0.93 |
| Example 35 | (1)/5% | J/1.5% | 250 msec | 0.34 μm | 0.94 |
| Example 36 | (1)/5% | K/1.5% | 280 msec | 0.33 μm | 0.93 |

EXAMPLES 37 TO 56 AND COMPARATIVE EXAMPLE 2 TO 3

(a) Preparation of Novolak Resin B

According to the same manner as the preparation of Novolak resin A in Example 1 to 24 except for changing the molar ratio of M-cresol/p-cresol/formaldehyde to 60/40/80, Novolak resin B was prepared.

(b) Preparation of Quinonediazide Type Sensitizer D 2,4,4-trimethyl-2',4',7-trihydroxyflavan and 1,2-naphthoquinonediazide-5-sulfonic acid chloride were reacted at a molar ratio of 1:2.6 to obtain a condensate (hereinafter referred to as sensitizer D).

(c) Sensitizing Agent

In addition to the sensitizing agents A–K used in Example 1 to 24, following sensitizing agents L–S were used:
L: 4-(9-anthrylcarbonyloxy)-3-hydroxybenzoic acid
M: 4,9,10-trihydroxy-1-anthryl-9-anthracene carboxylate
N: 1,4,9,10-anthracene tetrol
O: 2-t-butyl-9,10-diethoxyanthracene
P: 2-methyl-9,10-diethoxyanthracene
Q: 2,3-dimethyl-9,10-dimethoxyanthracene
R: 2-methylanthracene
S: 2-ethylanthracene (d) Preparation of Resist Solution and Evaluation Novolak resin A, Novolak resin B as shown in Table 3, 3 parts of Sensitizer D, 4 parts of 4,4'-(2-hydroxybenzylidene)di-2,6-xylenol as an additive and the sensitizing agents as shown in Table 3 were mixed in 45 parts of 2-heptanone and dissolved. In Comparative examples, the sensitizing agents were not mixed. Then, the solution was filtered through a 0.2 μm fluorine resin filter to prepare a resist solution.

Onto a silicon wafer treated with hexamethyldisalazane (HMDS) was spin-coated the resist solution obtained above so that the film thickness after drying became 0.85 μm. Prebaking was conducted on a direct hot plate at a temperature of 90° C. for 60 seconds. Thus obtained wafer on which a resist film had been formed was irradiated through a line and space pattern with changing the irradiation amount gradually using an i-line stepper ("NSR 2005i9C" manufactured by Nikon Corp., NA=0.57, σ=0.60). Then, on a hot plate, post exposure baking was conducted at a temperature of 110° C. for 60 seconds, followed by conducting paddle developing for 60 seconds using a 2.38% by weight tetramethylammonium hydroxide aqueous solution. The pattern after the developing was observed by a scanning electron microscope, and the effective sensitivity, resolution and focus depth thereof were evaluated and the results are shown in Table 3. Effective sensitivity and resolution were evaluated as described in Example 1 to 24 and focus depth was evaluated as follows.

Focus depth: It was represented by magnitude of the focus range wherein 0.40 μm line and space pattern can be resolved without film thickness reduction.

TABLE 3

| No. | Novolac resin A and B (part) | Sensitiz- ing agents (part) | Effective sensiti- vity (msec) | Reso- lution (μm) | Focus depth (μm) |
|---|---|---|---|---|---|
| Example | | | | | |
| 37 | A/5, B/5 | A/0.3 | 300 | 0.34 | 1.4 |
| 38 | A/6, B/4 | A/0.3 | 250 | 0.35 | 1.2 |
| 39 | A/6, B/4 | B/0.3 | 310 | 0.32 | 1.6 |
| 40 | A/4, B/6 | C/0.3 | 290 | 0.35 | 1.2 |
| 41 | A/5, B/5 | D/0.3 | 280 | 0.35 | 1.2 |
| 42 | A/6, B/4 | E/0.3 | 300 | 0.32 | 1.6 |
| 43 | A/7, B/3 | F/0.3 | 310 | 0.34 | 1.2 |
| 44 | A/7, B/3 | L/0.3 | 300 | 0.34 | 1.2 |
| 45 | A/7, B/3 | M/0.3 | 320 | 0.34 | 1.2 |
| 46 | A/7, B/3 | N/0.3 | 290 | 0.35 | 1.2 |
| 47 | A/6, B/4 | I/0.3 | 280 | 0.33 | 1.4 |
| 48 | A/6, B/4 | O/0.3 | 270 | 0.34 | 1.4 |
| 49 | A/6, B/4 | H/0.3 | 280 | 0.33 | 1.4 |
| 50 | A/6, B/4 | G/0.3 | 300 | 0.33 | 1.4 |
| 51 | A/6, B/4 | P/0.3 | 300 | 0.33 | 1.4 |
| 52 | A/6, B/4 | Q/0.3 | 300 | 0.34 | 1.4 |
| 53 | A/6, B/4 | R/0.3 | 250 | 0.35 | 1.2 |
| 54 | A/6, B/4 | S/0.3 | 260 | 0.35 | 1.2 |
| 55 | A/6, B/4 | J/0.3 | 260 | 0.35 | 1.2 |
| 56 | A/7, B/3 | K/0.3 | 310 | 0.35 | 1.2 |
| Compa- rative example | | | | | |
| 1 | A/5, B/5 | None | 260 | 0.4 | 0.6 |
| 2 | A/6, B/4 | None | 310 | 0.375 | 0.8 |

As mentioned above, by incorporating the acid generator in a positive resist composition comprising the alkali-soluble novolak resin and the quinonediazide type sensitizer, improved profile can be obtained without lowering sensitivity and resolution of the resist. Therefore, according to the present invention, profile can be improved remarkably without lowering various favorable properties such as sensitivity and resolution, in some case even improving these properties.

As mentioned above, by incorporating a compound represented by the formula (IV) or (V) in a positive resist composition comprising alkali-soluble novolak resin and the quinonediazide type sensitizer, there is provided a further excellent resolution without lowering focus depth. Therefore, according to the present invention, a positive resist composition excellent in the balance of various properties such as sensitivity, resolution, profile and focus depth can be provided.

What is claimed is:

1. A non-chemically enhanced positive resist composition comprising an alkali-soluble novolak resin, a quinonediazide sensitizer and at least one of the following compounds (a) and (b):

(a) an acid-generator which is decomposed by the action of an alkali developer and generates an acid and is represented by the following formula (I), (II) or (III):

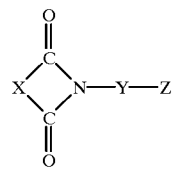

(I)

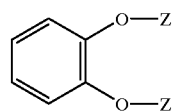

(II)

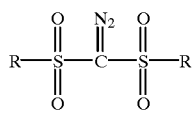

(III)

wherein X represents a divalent hydrocarbon group, Y represents a direct bond or an oxygen atom, Z represents

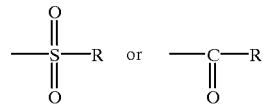

wherein R represents an alkyl which may be optionally substituted by alkoxy, halogen or nitro, alicyclic hydrocarbon residue, aryl which may be optionally substituted by alkyl, alkoxy, halogen or nitro, aralkyl which may be optionally substituted by alkyl, alkoxy, halogen or nitro, or camphor group, and (b) a compound selected from the group consisting of 9-anthracenemethanol acetate, 2-ethyl-9,10-dimethoxyanthracene, 2-methyl-9,10-dimethoxyanthracene, 2-t-butyl-9,10-dimethoxyanthracene, 2-ethyl-9,10-diethoxyanthracene and 2-methyl-9,10-diethoxyanthracene.

2. A positive resist composition consisting essentially of an alkali-soluble novolak resin, a quinonediazide sensitizer and at least one of the following compounds (a) and (b):

(a) an acid-generator which is decomposed by the action of an alkali developer and generates an acid and is represented by the following formula (I), (II) or (III):

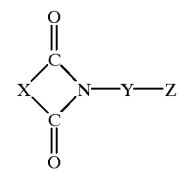

(I)

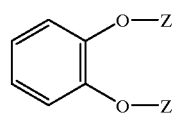

(II)

-continued

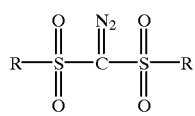
(III)

wherein X represents a divalent hydrocarbon group, Y represents a direct bond or an oxygen atom, Z represents

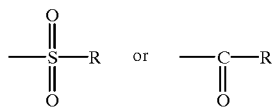

wherein R represents an alkyl which may be optionally substituted by alkoxy, halogen or nitro, alicyclic hydrocarbon residue, aryl which may be optionally substituted by alkyl, alkoxy, halogen or nitro, aralkyl which may be optionally substituted by alkyl, alkoxy, halogen or nitro, or camphor group, and (b) a compound selected from the group consisting of 9-anthracenemethanol acetate, 2-ethyl-9,10-dimethoxyanthracene, 2-methyl-9,10-dimethoxyanthracene, 2-t-butyl-9,10-dimethoxyanthracene, 2-ethyl-9,10-diethoxyanthracene and 2-methyl-9,10-diethoxyanthracene.

3. The positive resist composition according to claim 1 wherein the amount of the acid-generator is from 0.5 to 20% by weight based on the total solid weight in the composition.

4. The positive resist composition according to claim 3, wherein the acid-generator is represented by the following formula (Ia) or (Ib):

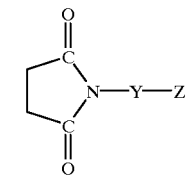
(Ia)

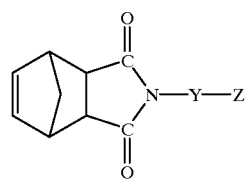
(Ib)

wherein Y and Z are defined as in claim 3.

5. The positive resist composition according to claim 3, wherein the acid-generator is selected from the group consisting of:

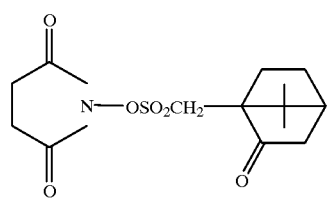
(1)

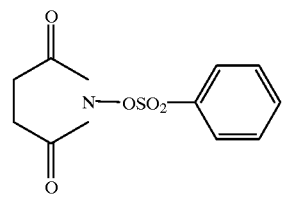
(2)

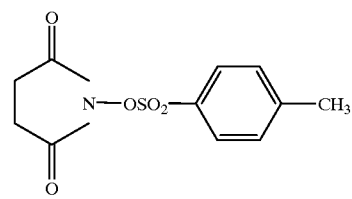
(3)

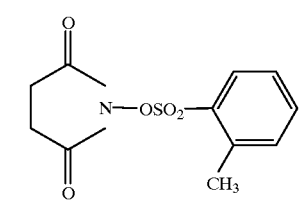
(4)

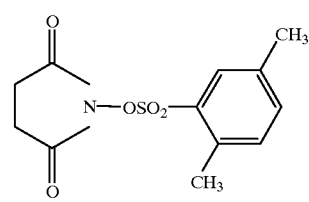
(5)

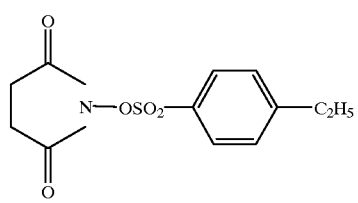
(6)

-continued
(7) 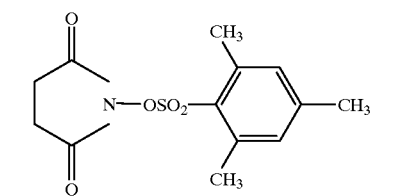
(8) 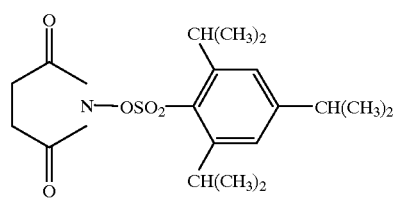
(9) 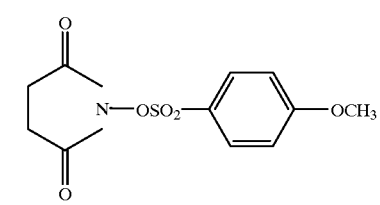
(10) 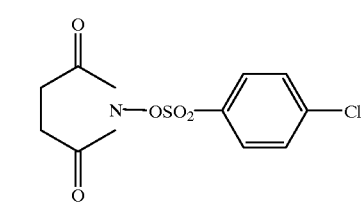
(11) 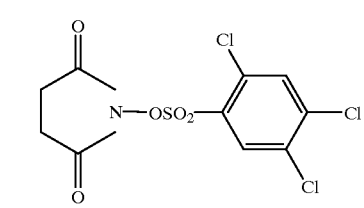
(12) 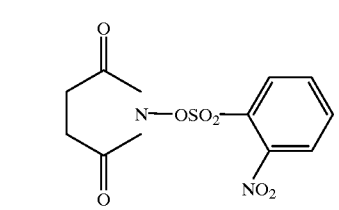
(13) 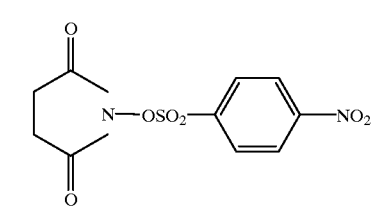
-continued
(14) 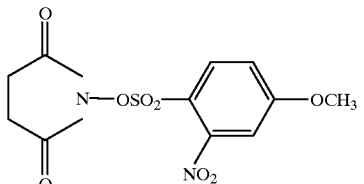
(15) 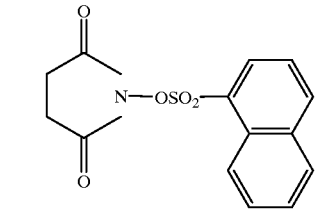
(16) 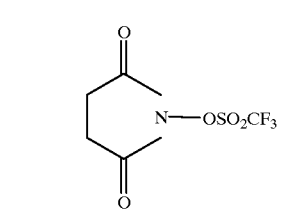
(17) 
(18) 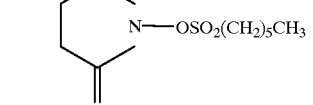
(19) 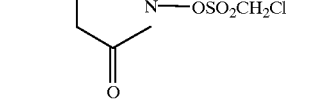
(20) 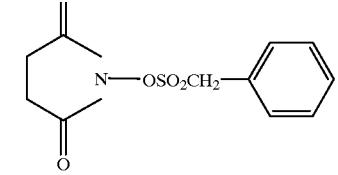

-continued
(21) 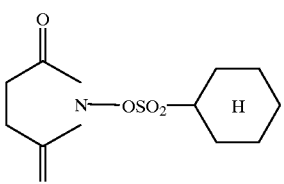
(22) 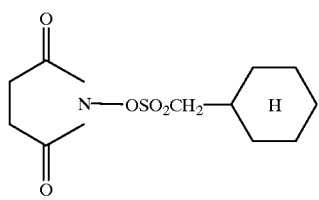
(23) 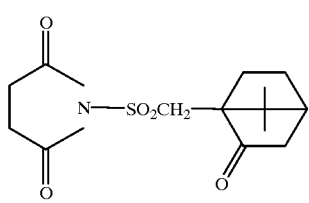
(24) 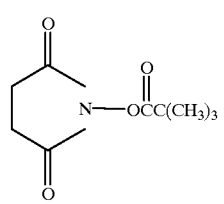
(25) 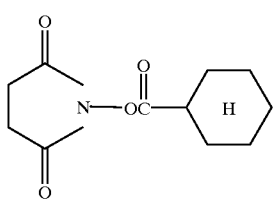
(26) 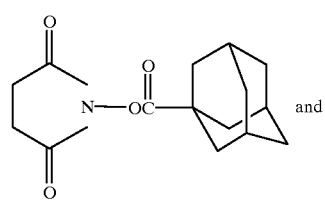 and
(27) 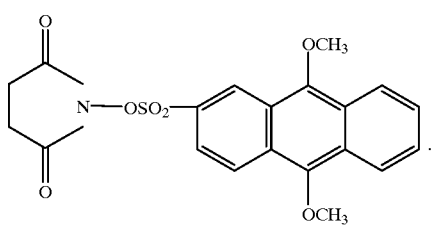
6. The positive resist composition according to claim 3, wherein the acid-generator is selected from the group consisting of:
(31) 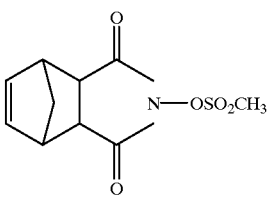
(32) 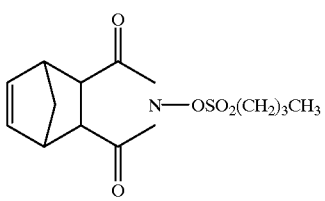
(33) 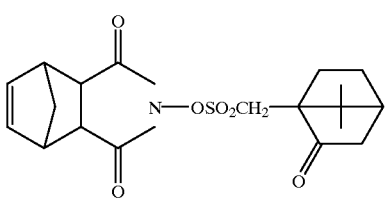
(34) 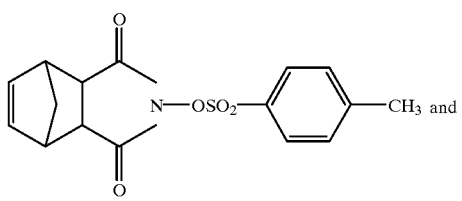 and
(35) 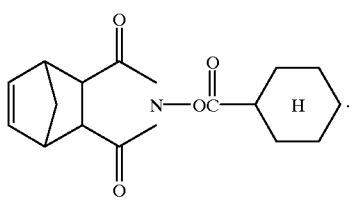.
7. The positive resist composition according to claim 3, wherein the acid-generator is selected from the group consisting of:

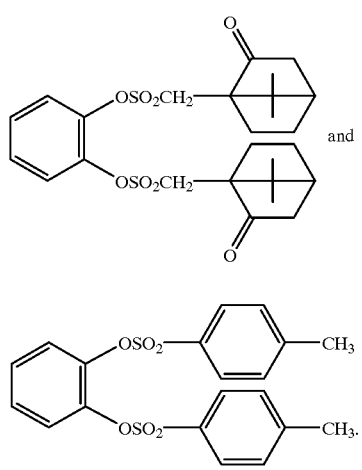
(41)
(42)
8. The positive resist composition according to claim 3, wherein the acid-generator is selected from the group consisting of:
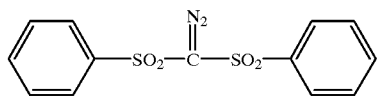
(51)
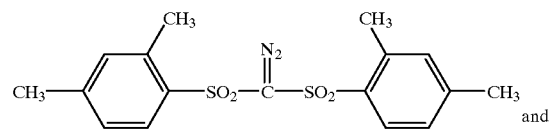
(52)
and
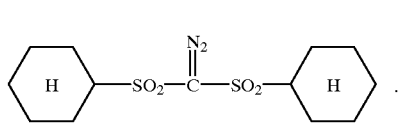
(53)
.
* * * * *